United States Patent [19]

Christian et al.

[11] Patent Number: 4,485,553

[45] Date of Patent: Dec. 4, 1984

[54] METHOD FOR MANUFACTURING AN INTEGRATED CIRCUIT DEVICE

[75] Inventors: Raymond R. Christian, Oaklawn; Harry Sue, Chicago; Herbert A. Waggener, Lincolnshire; Joseph C. Zuercher, Wilmette, all of Ill.

[73] Assignee: Teletype Corporation, Skokie, Ill.

[21] Appl. No.: 508,314

[22] Filed: Jun. 27, 1983

[51] Int. Cl.³ .................... H01L 21/78; H01L 21/95
[52] U.S. Cl. ................................ 29/589; 29/571; 29/577 C; 29/583; 357/80
[58] Field of Search ............... 29/571, 577 C, 583, 29/588, 589; 357/51, 54, 80; 219/216 PH, 543; 338/308, 305; 346/76 PH, 139 C; 156/631, 632, 662

[56] References Cited

U.S. PATENT DOCUMENTS

| | | | |
|---|---|---|---|
| 3,775,838 | 12/1973 | Dalmasso | 29/589 |
| 3,852,563 | 12/1974 | Bahorquez et al. | 346/76 PH |
| 3,889,358 | 6/1975 | Bierhenke | 357/51 |
| 4,110,598 | 8/1978 | Small | 346/76 PH |
| 4,134,125 | 1/1979 | Adams et al. | 357/54 |
| 4,266,334 | 5/1981 | Edwards et al. | 29/583 |
| 4,298,786 | 11/1981 | Marciniec | 219/216 PH |

Primary Examiner—Brian E. Hearn
Assistant Examiner—Hunter L. Auyang
Attorney, Agent, or Firm—W. K. Serp

[57] ABSTRACT

An integrated circuit 14 having an active circuit 19 is formed on a circuit wafer 10. A moat 18 in the field oxide 20 surrounds the active circuit 19. Metallic conductor 30 passes from a location on the active circuit 19 over the moat 18 to a contact area 22. The wafer 10 is covered with a photoshaped silicon nitride layer 18, and a support wafer 40 is secured with adhesive 46 to the circuit side of the circuit wafer 10. The circuit wafer 10 is photoshaped to expose the metallic conductor 30 at the contact area 22, and the contact area 22 is prepared with multiple metal layers 62, 66, 70 for connection to external wiring.

7 Claims, 5 Drawing Figures

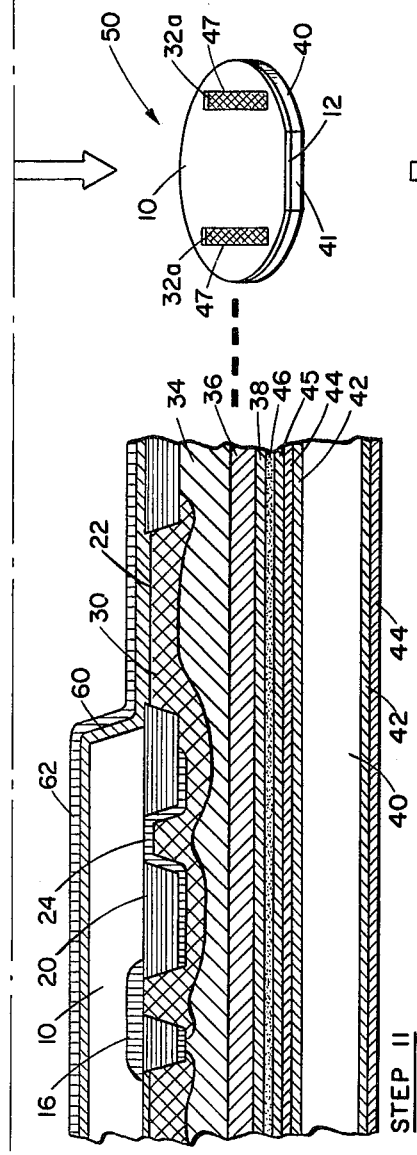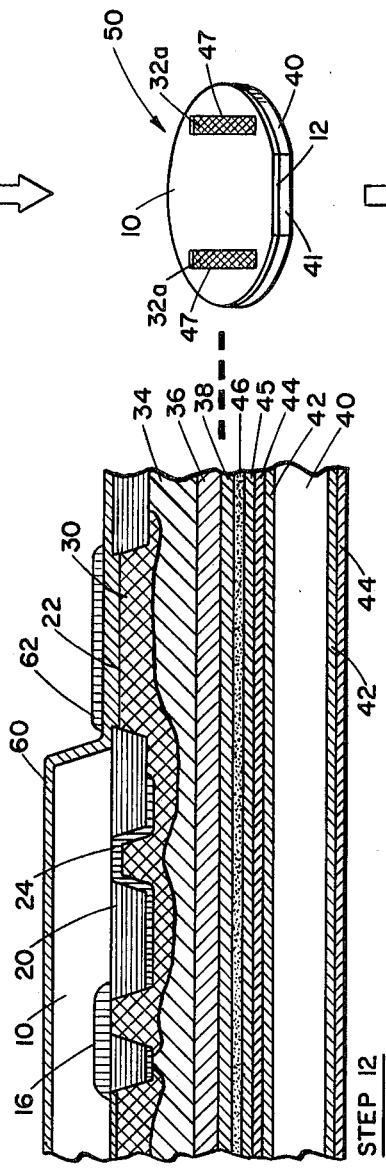
FIG. 3

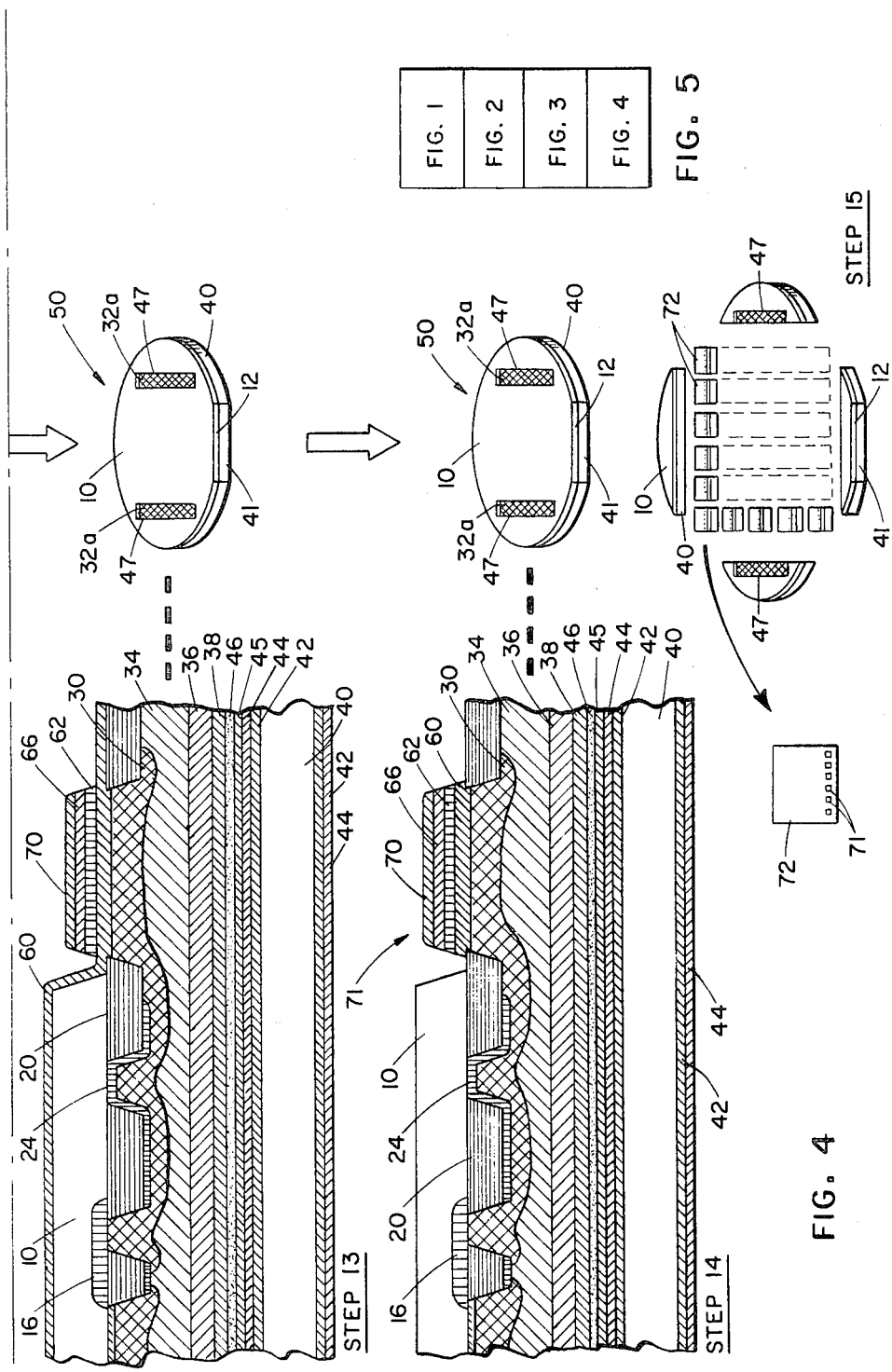

METHOD FOR MANUFACTURING AN INTEGRATED CIRCUIT DEVICE

TECHNICAL FIELD

This invention relates to a method for manufacturing an integrated circuit device which does not require post-fabrication packaging.

BACKGROUND ART

Although MOS integrated circuits have enjoyed increased use due to their high density characteristics, MOS integrated circuit chips are particularly susceptible to environmental contamination. To assure continuous, reliable operation, each integrated circuit chip is tested and subsequently mounted within a sealed package. A common package is an in-line package consisting of a rectangular body, of plastic or ceramic, within which the integrated circuit chip is mounted. Two parallel rows of pins extend from the package and are connected to selected locations of the integrated circuit. After packaging, the integrated circuit is again tested. Packaging and multiple testing greatly increases the manufacturing costs.

DISCLOSURE OF THE INVENTION

A method is described for manufacturing an integrated circuit device which is suitable for use without post-fabrication packaging. A silicon circuit wafer is processed to form an integrated circuit including an active circuit and at least one alignment pattern on a first surface of the circuit wafer. At least a portion of the active circuit is surrounded with a barrier to environmental contaminants. A support wafer is prepared and positioned with a first surface of the support wafer adjacent the first surface of the circuit wafer. A layer of adhesive is formed on the adjacent surface of the circuit and/or support wafer to allow the two wafers to adhere together forming a wafer sandwich. An opening is photoshaped through the circuit wafer exposing indicia corresponding to the alignment pattern. The circuit wafer is photoshaped using the exposed indicia for alignment to produce contact openings through the circuit wafer to selected contact surfaces of the integrated circuit. Conductors cross over the barrier supplying an interconnection between selected locations of the active circuit and contact surfaces outside of the active circuit surrounded by the barrier. The contact surfaces are prepared to withstand environmental corrosion, and the wafer is sliced into a plurality of chips.

Advantageously, the illustrated embodiment provides a method for manufacturing an integrated circuit device which is sealed from environmental corrosion and contamination and which does not require post-fabrication packaging and subsequent testing.

THE DRAWING

FIGS. 1 through 4, arranged as shown in FIG. 5, illustrate sequential process steps for manufacturing an integrated circuit device in accordance with this invention.

DETAILED DESCRIPTION

Figure 1:
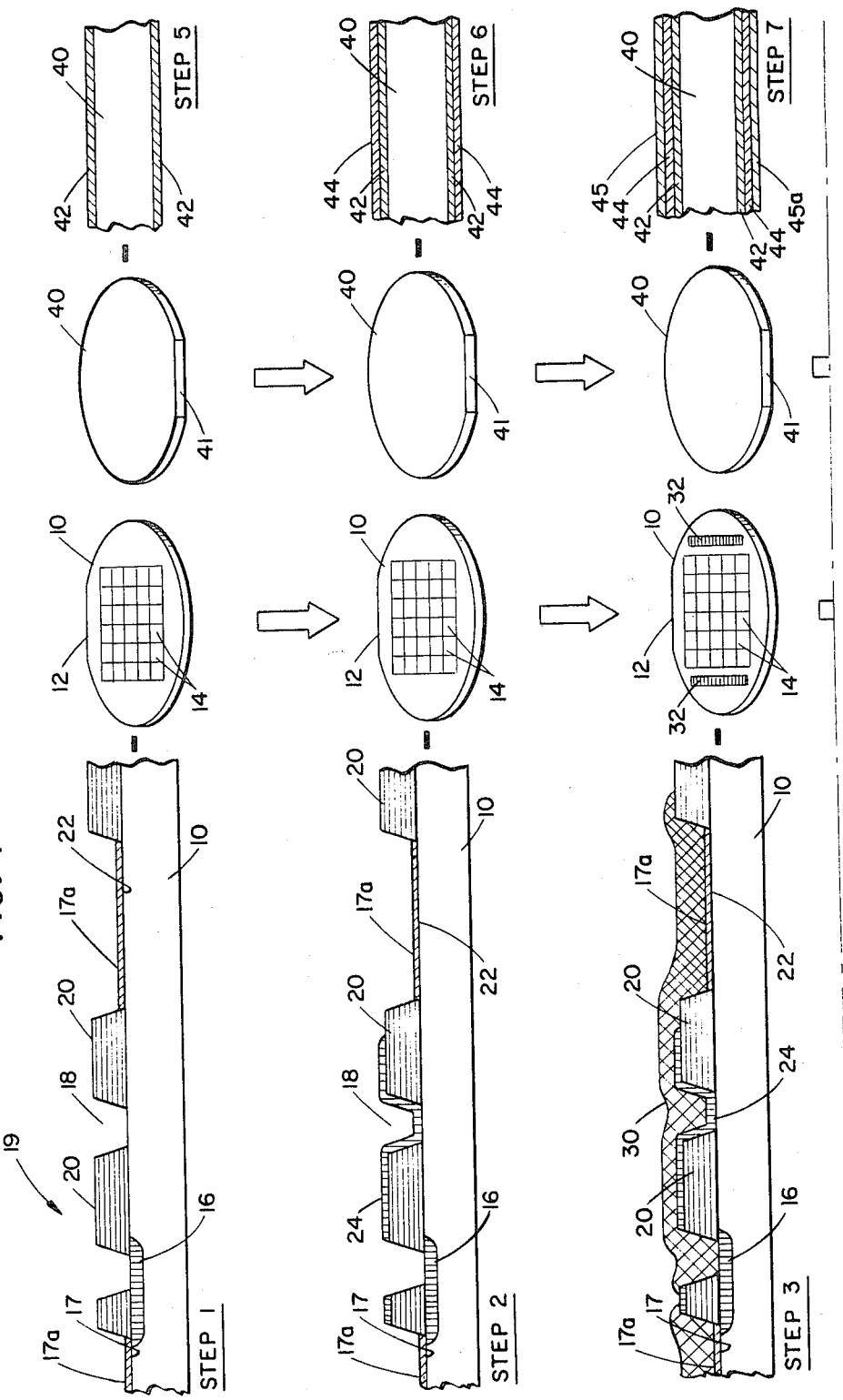
Figure 2:
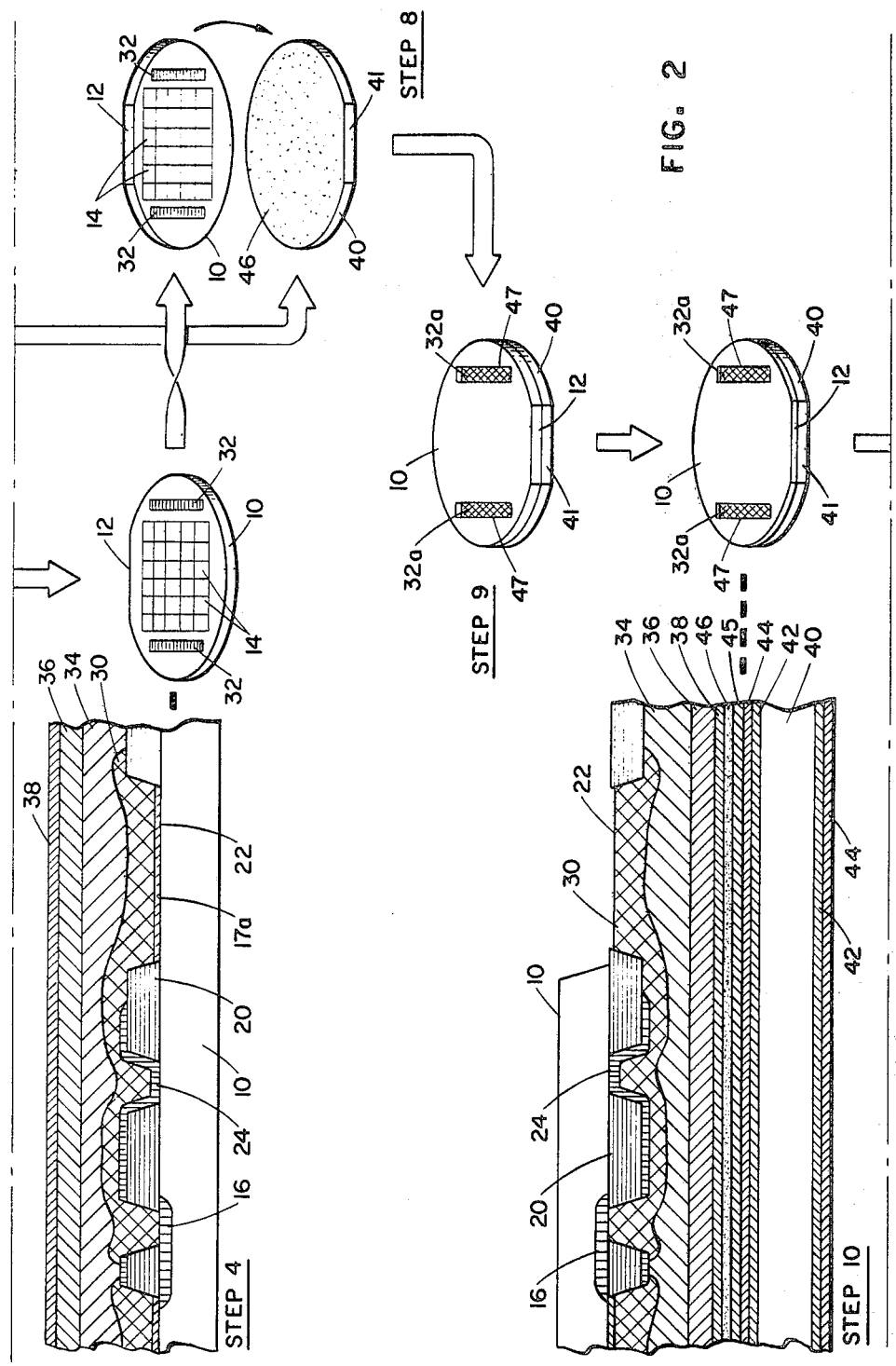

As shown in Step 1 of FIG. 1, a silicon wafer 10 having a major flat 12 has processed therein several distinct MOS integrated circuits 14 produced by conventional processing techniques well known in the art. A partial sectional view of an exemplary one of the integrated circuits 14 is illustrated in Step 1. Obviously, the drawing is not to scale and is exaggerated vertically to more clearly illustrate certain features. The integrated circuit includes an active circuit 19 including a doped region 16 and a gate 17 covered with a gate oxide 17a. It is well known that such active circuits are particularly susceptible to degradation by environmental contaminants such as sodium. A particular feature of the illustrated embodiment is the photoshaping of a trough or moat 18 in a layer of field oxide 20. The moat 18 surrounds all of the active circuit 19.

Additionally, the field oxide 20 is removed over a portion of the wafer 10 exposing a contact area 22 which is subsequently covered with the gate oxide 17a. The surface of the wafer 10 is covered with a thin layer of silicon nitride 24 preferably deposited by low pressure deposition at high temperatures. The nitride layer 24 is photoshaped and completely fills the moat 18 as shown in Step 2. The moat 18, filled with the silicon nitride 24, provides an edge seal for the active portion of the integrated circuit 19 excluding environmental contaminants therefrom. In Step 3, a metallic conductor 30 of aluminum is photoshaped on the wafer. The metallic conductor passes through the moat 18 and provides a conductive path from the doped region 16, on the integrated circuit, to the contact area 22. Additionally, alignment patterns 32 are photoshaped at two selected locations upon the wafer 10. The alignment patterns 32 will be used in a subsequent processing step.

In Step 4, the wafer 10 is covered with a silicon dioxide layer 34 followed by a silicon nitride layer 36 which is covered with a second silicon dioxide layer 38. The first silicon dioxide layer 34 improves adherence of the subsequent nitride layer 36 to the wafer, and the nitride layer 36 serves as a barrier to sodium and other environmental contaminants. The final silicon dioxide layer 38 is deposited over the nitride layer 36 by sputtering or other similar technique. The silicon dioxide layer 38 provides a compatible interface medium to adhesive which will be utilized in a subsequent step. It should be appreciated that the silicon nitride layer 24, the conductor 30, and the silicon wafer 10 provide primary contaminant barriers above and below the active circuit 19 with the moat 18 providing an edge seal. Secondary protection is provided by the silicon dioxide layers 34, 38 and the silicon nitride layer 36.

In Step 5, a support wafer 40 is exposed to an oxidizing environment at an elevated temperature causing the growth of silicon dioxide layers 42 upon the exposed surfaces of the support wafer 40. In Step 6, a layer of silicon nitride 44, providing an etchant barrier, is deposited upon the silicon dioxide layer 42. In Step 7, silicon dioxide layers 45 and 45a are deposited or alternatively grown upon the surfaces of the support wafer 40. The silicon dioxide layer 45 provides a compatible surface medium for the adhesive layer 46 applied in Step 8. The adhesive layer 46 may be applied by various techniques well known in the art. A particular method which has been found satisfactory is that of spinning the adhesive on the wafer 40 and, thereafter, outgassing the adhesive by placement of the wafer 40 into an evacuated chamber (not shown). In Step 8, the circuit wafer 10 and the support wafer 40 are brought together while maintaining the vacuum and the adhesive 46 is cured at high temperatures with the two wafers 10 and 40 forming a unitary sandwich 50. In Step 9, the circuit wafer 10 is photo-shaped creating openings 47 to expose alignment patterns 32a. The major flats 12 are used to coarsely align the wafer 50 during the photoshaping process. Upon removal of that portion of the circuit wafer 10 covering the alignment patterns, alignment patterns 32a as viewed through the openings 47 are illustrated in relief in the adhesive layer 46 proving alignment indicia for use in subsequent processing steps.

In Step 10, the contact areas 22 are uncovered by photoshaping which utilizes the previously revealed indicia for mask alignment. Additionally, the silicon dioxide layer 45a and the gate oxide 17a are removed. Thereafter, in Step 11, the wafer 10 is covered with a layer of titanium 60 followed by a layer of platinum 62. These layers 60, 62 are placed on the wafer 10 in an evacuated chamber (not shown) to prevent oxidation of the titanium 60 which condition would inhibit adherence of the platinum 62. In Step 12, the platinum layer 62 is photoshaped leaving the platinum 62 only over the contact area 22. The exposed titanium 60 oxidizes upon exposure to the atmosphere. Subsequently, two successive layers are electroplated over the platinum 62 with the titanium 60 serving as a conductive electrode. The oxidized surface of the titanium 60 prevents the various materials from plating thereon. Alternatively, a layer of resist may be used to prevent plating on the titanium surface. First, a stress-free nickel layer 66 is plated on the platinum 62. Next, a layer of solder 70 is plated over the nickel layer 66. In Step 14, the exposed titanium 60 is removed isolating the connection pad 71. The resulting connection pad 71 is suitable for reflow solder attachment to a cable (not shown). In the last Step 15, the wafer sandwich 50 is sliced into individual integrated circuit chips 72. The active portions of each of the integrated circuit chips 72 are completely sealed from environmental contaminants. All connections to the chips 72 are made through the connection pads 71. Thus, a method for manufacturing an integrated circuit device has been described which device does not require post-fabrication packaging.

While this invention has been particularly shown and described in connection with an illustrated embodiment, it will be appreciated that various changes may be made without departing from the spirit and scope of the invention as set forth in the following claims.

What is claimed is:

1. A method for manufacturing an integrated circuit device comprising the steps of:
    (A) processing a silicon circuit wafer (10) to form an integrated circuit (14) including an active circuit (19) and at least one alignment pattern (32) on a first surface of the circuit wafer;
    (B) surrounding at least a portion of the active circuit (19) with a barrier (24) to environmental contaminants by forming a moat (18);
    (C) placing a conductor (30) over the barrier (18, 24) placed in Step B to provide an interconnection between a selected location of the active circuit (19) and a selected contact surface (22) outside of the portion of the active circuit surrounded by the barrier (24);
    (D) preparing the surface of a support wafer (40) for subsequent processing;
    (E) positioning the first surface of the circuit wafer (10) opposing the first surface of the support wafer (40);
    (F) forming a layer of adhesive (46) on the opposing first surfaces of said circuit and support wafers (10, 40) so as to cause the two wafers to adhere together forming a wafer sandwich (50);
    (G) photoshaping an opening (47) through the circuit wafer (10) to expose indicia (32a) corresponding to the alignment pattern (32);
    (H) photoshaping the circuit wafer (10) using the indicia (32a) exposed in Step F to produce contact openings through the circuit wafer (10) to selected contact surfaces (22) of the integrated circuit (14);
    (I) preparing the contact surfaces (22) exposed in Step H; and
    (J) slicing the wafer sandwich (50) into a plurality of chips (72).

2. The method of claim 1 wherein the moat (18) is in a field oxide layer, and the barrier is a silicon nitride layer (24) over the moat (18).

3. The method of claim 1 wherein the layer of adhesive (46) formed in Step E is placed by spinning the support wafer (40) with a small quantity of adhesive (46) placed thereon.

4. The method of claim 1 in which preparing the contact surfaces in Step I includes the steps:
    (K) in a vacuum environment, covering the circuit wafer (10) with a layer of titanium (60) followed by a layer of platinum (62);
    (L) photoshaping the platinum (62) so that a platinum pad remains over the contact area (22);
    (M) plating the platinum pad with a selected metal (66); and
    (N) removing any exposed titanium (60).

5. The method of claim 4 wherein in Step M the selected metal is nickel (66) and the method comprises the further step:
    (O) plating a layer of solder (70) over the nickel (66).

6. The method of claim 1 which further includes the step of placing a layer of material (36) which provides a barrier to environmental contaminants, over the first surface of the circuit wafer (10) prior to Step E.

7. The method of claim 1 which further includes outgassing the adhesive (58) applied in Step F prior to adhesion of the wafers (10, 50) into a wafer sandwich (60).

* * * * *